United States Patent [19]

Barnes et al.

[11] Patent Number: 4,971,947
[45] Date of Patent: Nov. 20, 1990

[54] SUPERCONDUCTOR MAGNETIC READING AND WRITING HEADS

[75] Inventors: Frank S. Barnes, Boulder, Colo.; Matthew P. Dugas, St. Paul, Minn.

[73] Assignee: University of Colorado Foundation, Inc., Boulder, Colo.

[21] Appl. No.: 209,155

[22] Filed: Jun. 20, 1988

[51] Int. Cl.$^5$ .................. G11B 5/235; G11B 5/127
[52] U.S. Cl. ......................... 505/1; 360/125; 360/120
[58] Field of Search .................. 360/119, 120, 125

[56] References Cited

U.S. PATENT DOCUMENTS

| | | | |
|---|---|---|---|
| 3,072,750 | 1/1963 | Barry | 360/121 |
| 3,246,384 | 4/1966 | Vice | 360/120 |
| 3,508,014 | 4/1970 | Mersing | 360/120 |
| 4,541,026 | 9/1985 | Bonin et al. | 360/121 |
| 4,646,184 | 2/1987 | Goto et al. | 360/110 |

FOREIGN PATENT DOCUMENTS

| | | | |
|---|---|---|---|
| 57-120221 | 7/1982 | Japan | 360/120 |
| 60-151315 | 5/1985 | Japan . | |

OTHER PUBLICATIONS

"Superconductors" by A. Ellis, Journal of Chemical Ed. pp. 836–841, vol. 64, No. 10, Oct. 1987.

Primary Examiner—John H. Wolff
Attorney, Agent, or Firm—Earl C. Hancock

[57] ABSTRACT

Read/write heads for exchanging information with a magnetic media in either vertical or horizontal recording modes include SQUID detectors coupled to the magnetic flux path of the head. Selective use of superconducting material improves the data interchange operating efficiency of the read/write head and its coils. Magnetic paths associated with head elements are confined and directed by superconducting material to produce compact data with minimal power requirements. Magnetic read/write heads containing Josephson junction or SQUID detectors and which are encased in superconductive material allow high density data recording and highly sensitive data detecting. Data density is also improved by selected application of superconductive material to magnetic read/write heads constructed for perpendicular recording.

21 Claims, 3 Drawing Sheets

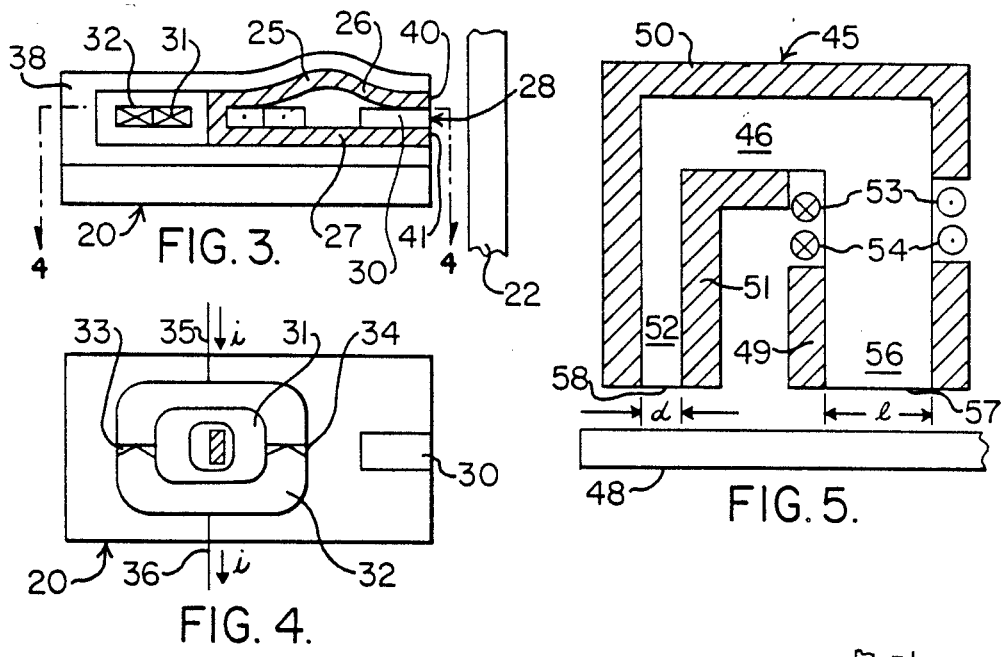
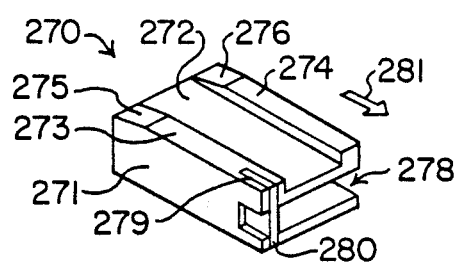
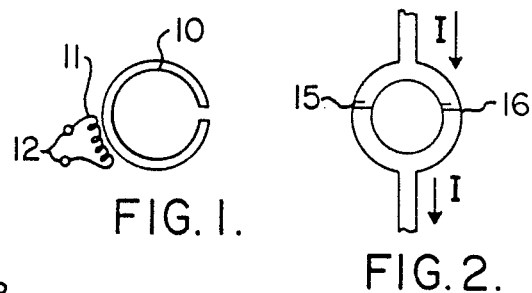
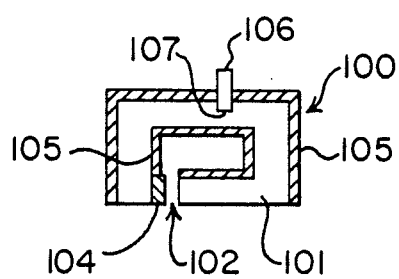
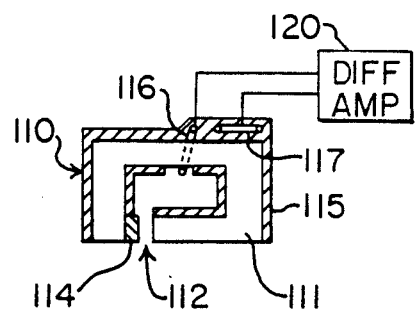

SUPERCONDUCTOR MAGNETIC READING AND WRITING HEADS

TECHNICAL FIELD

The present invention relates to methods and apparatus for reading and/or writing information on magnetic materials. More particularly, this invention relates to read and write heads utilizing superconductors to provide highly efficient packing and sensing of data with respect to a magnetic data storing media. The invention is especially useful for magnetic recording in conjunction with magnetic disks, magnetic tape, and other information storage systems. By this invention, it is possible to realize magnetic data densities competitive with, or better than, optical disk systems while maintaining remarkably high levels of efficiency in association with traditional magnetic information storage devices.

BACKGROUND

Heads for exchanging information in the form of distributed magnetic patterns depend for their utility upon the handling of magnetic flux within a magnetic circuit. That is, such heads sense or transmit information by handling magnetic flux within their magnetic circuits. Magnetic writing is accomplished by injecting a magnetic flux into the head magnetic circuit and thence to the magnetically receptive and retentive medium. This is normally a function provided by energizing a coil coupled to the magnetic flux path.

Where detection of data from the medium is via a coil around the flux path, detected signals are proportioned to the flux change rather than the steady state flux magnitude. Conversely, where a magnetoresistive device or a SQUID is employed, the magnitude of the flux linking the device is sensed directly. SQUID is a contemporary acronym for Superconducting Quantum Interference Device. There are a variety of prior art approaches to concentrating and controlling the magnetic field in magnetic read/write heads for recording and reading with respect to magnetic media.

The magnetic flux circuit for conventional such heads are sometimes established by fabricating the head in a ring configuration ending in a gap or by bonding C-bar and I-bar units with a defined gap therebetween. Some prior art such heads included metal in the gap for the purpose of diverting the magnetic flux outwardly from the gap towards the magnetic media.

Sometimes the gap flux concentration enhancements take the form of sandwiches of conducting and insulating material to establish eddy currents at the gap to create magnetic forces diverting the flux from the head circuit. Examples of this are shown in U.S. Pat. Nos. 3,072,750 by Barry, 3,246,384 by Vice, 3,508,014 by Mersing and 4,646,184 by Goto et al. Japanese application Ser. No. 60-151315 by Ogawa which it is understood was published on Aug. 14, 1984 employs a recording head with the magnetic flux path interrupted at the gap by a superconductor material. It is known that a material in its superconductive state may block passage of magnetic flux therethrough with appropriate thickness, quality and H-field level (the Meissner effect). It may also guide magnetic flux through vortex regions and bend flux lines towards the material surface. Accordingly, the superconductive plug in the Ogawa head gap should cause maximum magnetic flux density outwardly from the gap and in the direction of the media.

Typically data is recorded on a magnetic media by magnetizing a magnetic layer of the media in a longitudinal direction parallel to the direction of relative movement between the head or transducer and the medium. It is known that improved data density on the media is possible by the use of perpendicular data cell recording. For perpendicular recording, data cells are established by magnetizing the magnetic recording layer in a direction perpendicular to the media surface.

Further data density improvements are obtained by applying thin film construction techniques to the assembly of magnetic read/write heads. An arrangement for perpendicular recording with laminated thin film layers including both a read/write element and a tunnel erase pole is shown in U.S. Pat. No. 4,541,026 by Bonin and Dugas. Longitudinal recording heads fabricated from dual C-bar or C-bar and I-bar combinations are further enhanced by incorporating metal in the recording gap (ie: metal-in-gap or MIG type read/write heads). To reduce the prospect of erroneous readings from the gap at the interface between the main body flux path and one of the metal layers, it is known to space the MIG head at the non-recording interfaces in offset relation from the media recording surface by a wedge of non-magnetic material.

Contemporary superconductor material are evolving as are SQUID types of extremely sensitive magnetic field detecting structures. One configuration for a SQUID employs two parallel Josephson junction devices.

Despite the more recent advances in superconductor material, none of the known prior art has effectively harnessed the phenomenon so as to realize the highly efficient and high density magnetic reading and writing as is obtained by the present invention.

DISCLOSURE OF THE INVENTION The present invention advantageously utilizes superconductor material to produce several unique features. One feature resides in magnetic read/write heads which include a magnetic circuit member typically configured in somewhat of a U-shape and having a gap (at the extremities of the arms forming the U-shape, for example) and a coil, detector, or both, magnetically coupled to the magnetic circuit member. Another feature of this invention is to employ a SQUID detector coupled to the magnetic circuit member.

In another feature of the invention, the magnetic circuit gap is at least partially filled with a superconductor material for diverting magnetic flux at the gap in an outward direction. Another especially advantageous result of this structure is all available flux from the media is concentrated into the magnetic circuit of the head for highly efficient data reading purposes.

Yet another feature which allows extremely high data densities with minimal magnetic flux loss is to encase the external surface of the magnetic circuit member in superconductor material except at the gap or pole face. The superconductor acts as a magnetic field insulator during both write and read operations. This both confines the writing flux to the desired region and prevents the pick up of interfering signals such as from adjacent bits during the read operation. The introduction of current to the coil so as to establish a magnetic flux in the magnetic circuit member results in a highly concentrated field at the external face of the poles around the gap whereas the presence of a magnetic field at the pole face will produce magnetic flux patterns at a SQUID detector even for remarkably weak magnetic fields. Both vertical and horizontal recording geometries are improved by the use of the superconductor to reduce leakage flux.

The readback flux linked to the detector coil or SQUID is always relatively small. The improvement in circuit efficiency by use of the present invention is significantly advantageous in readback operations. Accordingly the value of the present invention is most apparent in conjunction with data reading functions where the flux available at the detector SQUID or coil is substantially concentrated by the head encasing superconductor material.

In another form of the present invention, a read/write head is configured with a similar magnetic flux path defining member having superconductive material in the gap and further including a superconductive detector or SQUID in circuit with the coil or coils magnetically coupled to the magnetic flux path. This circuit enables one to read very small magnetic fields, or changes in the magnetic field, which represent a stored bit. In the case of a DC SQUID, changes in flux are converted to changes in the voltage across the SQUID.

In still another form of the present invention, thin films of magnetic material are placed in cooperative relation with superconductive elements or coatings. This can take the form of a sandwich relationship with a magnetic flux introducing coil overlying a superconductor barrier which acts as a switch. That is, the barrier changes from its superconducting state in the presence of writing current in the coil but returns to its flux isolating superconductor state during reading to maximize flux linked to the head for the detection of low level read signals from a magnetic media.

Still further, heads disclosed herein can realize reduced sensitivity to erroneous signals from secondary gaps or edges between magnetic material by offsetting those interfaces through intervening blocks or wedges of non-magnetic material at the media to head interface. In some configurations, the head efficiency is significantly enhanced by utilizing superconductors for the offsetting wedges.

While not limited thereto, the present invention is particularly well suited for implementation in single pole or probe types of magnetic read/write heads which are especially advantageous for use in high density, perpendicular magnetic recording and detecting systems.

As used herein, an MSP head is an M-shaped single pole head, an NSP head is an N-shaped single pole head, and an ESP head is an E-shaped single pole head.

Those having normal skill in the art will recognize the foregoing and other objects, features, advantages and applications of the present invention from the following more detailed descriptions of the preferred embodiments as illustrated in the accompanying drawings.

BRIEF DESCRIPTION OF THE DRAWINGS

FIGS. 1 and 2 are conventional Josephson junction detectors or SQUIDs suitable for use as RF and DC current detectors, respectively.

FIG. 3 is a side, section view of a magnetic read/write head in accordance with this invention.

FIG. 4 is a top, section view of the FIG. 3 read/write head showing the position of a Josephson junction detector.

FIG. 5 is a section view of a magnetic read/write head in accordance with this invention which is arranged for perpendicular magnetic recording on a media.

FIG. 6A is a section view of another magnetic read/write head embodiment in accordance with this invention.

FIG. 6B is an embodiment of a head similar to FIG. 6A but with a different SQUID coupling arrangement.

FIG. 17 is an isometric view of a glider assembly for mounting read/write heads and advantageously utilizing superconductor materials in accordance with this invention.

DETAILED DESCRIPTION OF THE PREFERRED EMBODIMENTS

Figure 7:
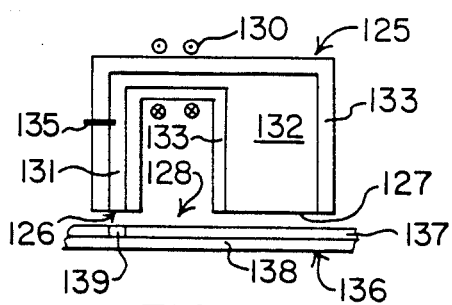
FIG. 7 is another read/write head configuration suitable for perpendicular magnetic recording.

The present invention employs high-temperature (high-Tc) superconductors to improve performance of magnetic recording on a medium including disks and tapes. The invention is particularly well suited for advantageously utilizing the magnetic flux and/or magnetic field change detection capabilities of SQUIDs or superconducting Josephson junction devices such as those illustrated in FIGS. 1 and 2 in read/write heads.

The FIG. 1 Josephson junction is formed of a gapped superconductor loop 10 which is magnetically coupled to coil 11. The device is tuned and biased by RF current induced in coil 11. Detection at output terminal 12 is in response to presence of an upper harmonic of the RF bias frequency. That is, a change of the quasi-static applied flux produces a higher frequency component. Josephson junction devices work as magnetic flux to voltage converters with an optimum sensitivity of a few magnetic flux quantums and outputs in the microvolt range.

FIG. 2 illustrates a DC SQUID wherein two Josephson junctions 15 and 16 are positioned to detect the presence of current I flowing through conductive material in response to the presence of a magnetic field. Josephson junction devices 15 and 16 provide an output voltage which varies with the magnetic flux in a quantified way that allows detection of changes of a few discrete flux quanta and possible encoding of $2^n$ bits per position.

The FIG. 1 and 2 superconductor Josephson junction pairs or SQUIDs 10 and 15/16 detect changes in the magnetic flux as the flux gathering head travels over the surface where bits are present on a magnetic disk or tape. Typically the data significance of the recorded bits is correlated to transition boundaries of magnetized cells on a media. SQUIDs are preferably coupled to superconducting loops which have inductance but no resistance. The SQUID has extremely low noise characteristics and will detect a single, static flux quantum under proper circumstances. That is, a SQUID can detect information in a static magnetic flux field even without dynamic motion between the media and the detector head. In the past, SQUIDs required a liquid helium environment for successful operation.

However, the development of materials that assume a superconductive state at temperatures as high as 95°K has renewed focus on such devices. For example, by using barium-yttrium-copper oxide material, it is feasible to operate the entire assembly at liquid nitrogen temperatures of 77° Kelvin or higher. As the evolution of new materials continues, it is clear cooling requirements will present even less operating restrictions. Use in dry ice or room temperature environments appears ultimately possible for SQUIDs.

The SQUID is attractive since it is well suited to function digitally and might allow information storage at multiple levels of the field, allowing high bit densities per unit of space. However, even if SQUIDs are restricted to contemporary materials, it is estimated that, in accordance with this invention, signal-to-noise ratios are possible at higher than 1000 to 1 for SQUID detectors reading magnetic bits as small as 2 by 1 microns. This represents an increase by approximately a factor of 20 in recording density over that currently available with the best high-density magnetic disk. Both RF and DC SQUIDs appear promising.

Another use of superconducting coils is as part of a write circuit. This reduces the RC time constant in the drive circuit as well as reducing heat dissipation. Using the integrated thin film head with thin film superconducting coils of only a few square microns in cross-sectional area can generate the write fields. FIG. 3 is a section view of a magnetic head 20 using the Meissner Effect of superconducting material in the gap and throat area. Head 20 is also shown in a top, section view in FIG. 4.

Head 20 is formed with a ferrite or, if a thin film head, a high moment magnetically soft alloy layer 25 which is formed in a generally U-shape so that upper pole 26 and lower pole 27 terminate with a gap 28 in proximity to media 22. Gap 28 is filled with a plug 30 of superconductive material. The interior bend of U-shaped member 25 is magnetically coupled with two coils or superconducting loops 31 and 32, the latter including two Josephson junction detectors 33 and 34 (FIG. 4) to sense the presence of magnetically induced currents "i" at output leads 35 and 36.

Coil or loop 31 is connected to external leads (not shown) which are selectively energized to generate the magnetic flux for appropriate writing on media 22. Note that, since a superconducting environment is already available, further operating efficiency is realizable for heads in accordance with this invention by fabricating coil 31, coil 32, or both of them, as loops of superconductive material As best seen in FIG. 3, head 20 is encased in superconductor layer(s) 38 on inert substrate 39. Note that it is also possible to use superconductive material for the substrate.

Note that the outer faces of pole tips 40 and 41 (note FIG. 3) are not encased by superconductor layer 38. While the flux flows from one pole to the other on both reading and writing in contemporary heads, encasing layer 38 is deposited in a configuration that effectively intercepts magnetic flux fields and directs them into a well defined, concentrated area for sensitive recording and detecting in an extremely high density of data relative to a magnetic media 22. Media 22 typically is a magnetic recording disk or the like although the invention is suitable for use with other media such as magnetic tape or superconductor disks. Media employing one or more superconductor layers are attractive for recording systems such as those using heads adapted for vertical recording along the lines of those described subsequently herein.

In a typical thin-film head 20, the throat which is comprised of the magnetic pole pieces 26 and 27 and nonmagnetic gap material 30, represents a shunt path for the magnetic flux for both read and write. The desire is to minimize this throat length in order to increase the head efficiency for both the read and write functions. If the "gap" material 30 and also the material surrounding the pole pieces in the throat area are made of a superconductor, no flux is lost from leakage across gap 28 as the Meissner effect precludes this from occurring. In effect the throat length (or height) becomes a less critical parameter of head performance. This means the head efficiency is maximized as a function of the magnitude of the Meissner effect. That is, stray paths are minimized which maximizes the magnetic circuit efficiency by eliminating the stray reluctances (inductances) so that the circuit approaches the ideal magnetic structure. Furthermore, it is possible that the need for lapping the throat height to a precise length is avoidable.

Many benefits stem from this configuration. Write efficiency is enhanced which results in much lower current demand. The Meissner effect causes a higher head field amplitude and sharper head field gradient for a given number of ampere-turns of the write coil. This will make for a much sharper magnetic transition in the media due to a much better defined magnetic field in the recording zone of the head. This in turn allows for increasing the recording density.

By surrounding the pole pieces with superconductive material as shown, the complete Meissner effect perfectly shields the sides of the pole pieces from picking up magnetic patterns from adjacent tracks or from external sources. For instance, the edge of the pole piece tends to pick up signals from adjacent tracks, albeit with a substantial separation loss. A much longer throat is possible if it is shielded by a superconductor. Due to the complete coverage of superconductor material around the pole pieces, adjacent cross-talk is minimized. Further reduction of the effects of cross-talk in reading is obtainable by introducing a second SQUID which is not coupled to the read gap and operating the two SQUIDS in a differential mode. This could prove useful to balance out magnetic fields from superconductor/magnet bearing assemblies and superconductor motors.

The FIG. 3 and 4 magnetic read/write head embodiment advantageously utilizes the Meissner Effect. By sheathing the horseshoe shaped thin film magnetic path defining member 25 with superconductor material 38, the superconductor layers prevent the magnetic fields from escaping beyond the outer surfaces of head 20 except at faces 40 and 41 at gap 28 in proximity to recording media 22 as shown. Thus heads constructed like head 20 are extremely efficient with no interference between writing elements if more than one are arrayed on a single substrate or assembly. Furthermore, the geometry of the recording flux at the read/write gap 28 is sharply focused and extremely small. Heads pursuant to the FIGS. 3 and 4 embodiment are particularly well suited for horizontal magnetic recording orientation. As described below, heads for vertical recording will exhibit similar improvements by using a superconductor to reduce leakage flux.

As discussed previously, magnetic recording transducers generally fall into two classes. Ring type heads employ a magnetic flux path ring with a gap breaking the continuity of that circuit. Resolution is mostly a function of the length of the gap. The other class of head is the single-pole or probe type head that employs an elongated film or strip to link the magnetic flux sensed by the head with an operatively associated coil or detector. For this type head, resolution is predominantly a function of the length or thickness of the main pole piece at its interface to the medium. It is generally well known that single pole piece type heads are advantageous for the high density of perpendicular recording and thus preferred over ring type heads for such purposes.

The FIG. 5 embodiment is especially useful when vertical magnetic orientation of recording and reading is desired. Read/write head 45 has a core member 46 in a generally U-shaped configuration and made of ferrite or high mu material. Member 46 is positioned in proximity to magnetic media 48. A superconductive material forms an external case 50 for member 46 and includes internal coatings 49 and 51 for arms 52 and 56, respectively. Coils or superconductor loops 53 and 54 encircle auxiliary flux path arm 56 but do not have an interior superconductor coating thereunder to permit direct magnetic coupling to member 46 via arm 56.

One of coils 53 and 54 contains a magnetically responsive device coupled to the magnetic circuit such as a Josephson junction detector (not shown) and the other coil is used for selective energizing during magnetic writing. Note that the vertical magnetic recording orientation is created by maintaining the dimension "L" at pole face 57 for auxiliary pole 56 much greater than dimension "D" of pole face 58 for main pole piece 52.

FIG. 6 illustrates yet another embodiment of a magnetic read/write head 100 in accordance with this invention. Here the magnetic circuit is formed by member 101 which has a gap 102 partly filled by superconductor plug 104. The exterior surface of head 100 is encased with a superconductor film 105 except along the surface including the gap 102 and at a slot which is filled with SQUID detector 106. While it is possible to encircle core 101 with SQUID 106, it is also acceptable to incorporate a notch 107 in magnetic flux path 101 and to implant SQUID 106 in notch 107 as shown. Thus SQUID- 106 will detect even small magnitudes or changes in the magnetic flux contained within the magnetic circuit defined by member 101. Other schemes for varying the coupling of the SQUID to the magnetic circuit may prove useful in optimizing the SQUID circuit inductance and sensitivity.

Head 110 of FIG. 6B is similar in configuration to FIG. 6A in the use of a magnetic circuit 111 with a gap 112. The detection is obtained by a somewhat different arrangement in that two DC SQUIDs 116 and 117 along the lines of FIG. 2 are included as shown. The purpose of SQUID 117 is to sense magnetic flux signals from stray or random sources so as to prevent them from producing a false output. In the FIG. 6B exemplary embodiment, both SQUID 116 and 117 are within the encasing superconductor coating 115 but only SQUID 116 is magnetically coupled to magnetic circuit 111. However, both detectors are in the same environment relative to stray magnetic fields. The outputs of both SQUIDs are coupled to a differential amplifier 120. As a result, the effects of stray fields which might penetrate the superconductive shielding are eliminated while sensitivity to the fields within magnetic circuit 111 is maintained at an optimum.

The application of the superconductor material not only provides focusing of the write field from the head 20 when used as a gap material, but, when used as a readback coil, it also eliminates thermal noise during reading as caused by typical resistive coils. The RMS value of thermal noise is the square root of 4kTBR, where "k" is the Boltzman constant, T is the wire temperature, B is the system frequency bandwidth, and R is the wire resistance. Maintenance of R substantially at zero by superconductivity means the thermal noise becomes zero.

When considering a typical thin film head structure, making the read/write coils 31/32 as loops of superconductive material will lower or eliminate both heating effects during write operation and thermal Johnson noise during read operation. Current density limitations may dictate fabricating the read/write coil from a high-temperature superconductor/room temperature conductor sandwich. The sandwich configuration could prove effective to overcome any tendency of the write current density to switch the superconductor to the "normal" state. Then the normal conductor would carry the current.

FIG. 7 is a version of read/write head 125 which is considered a single pole type because the gap 128 between the main or recording pole face 126 and the auxiliary pole face 127 is significantly greater than the length of the recording pole face 126. A writing coil 130 surrounds the upper extension of the main pole element 131 which forms the internal head magnetic circuit in conjunction with auxiliary pole 132. Poles 131 and 132 are encased with superconductor coating 133 both inside and out except at the faces 126 and 127 which interface with media 136.

As illustrated in FIG. 7, the data is detected when the device is in a read mode by a magnetically responsive transducer shown here as SQUID 135 coupled to intercept the magnetic flux. In contrast to the write mode discussed below, superconductor layer 133 remains in a superconductive state throughout the reading operation.

For writing, a current is introduced to coil 130 with suitable current density so that the superconductor layer under coil 130 loses its superconductor Meissner characteristics to allow the magnetic flux to pass therethrough into the magnetic circuit of head 125. The portions of superconductor layer 133 that do not underlie coil 130 do not lose their superconductive state thereby concentrating the magnetic flux through recording pole face 126 establishing a small perpendicularly magnetized cell 139 representing recorded data. The flux return path is through the magnetically soft back layer 138 to the relatively large surface area auxiliary pole face 127 which results in sufficiently low flux density so as not to magnetize the media 136 facing it.

As soon as current is removed from coil 130, coating 133 returns to its superconductive state which is not disturbed by the presence of the much lower magnetic flux detected during a read operation. One example of the composition of a recording media suitable for 136 is a layer 137 of cobalt-chromium on a base 138 of a magnetically soft material.

Figure 8:
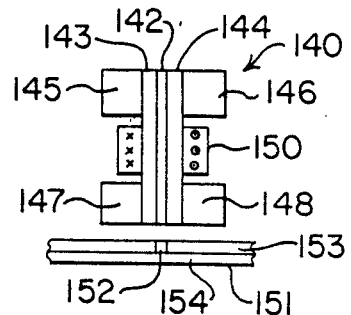
FIG. 8 is a single pole read/write head embodiment constructed with thin film techniques useful for perpendicular recording.

FIG. 8 is another head 140 useful for perpendicular magnetic recording constructed in an I-bar configuration. A thin film 142 of soft magnetic material forms a core sandwiched between layers 143 and 144 of superconductor material. Bulk superconductor may be used to form end segments 145–148 on either side of coil 150. Writing of a perpendicular data cell 152 in upper layer 153 of media 151 is accomplished by actuating coil 150 so that it causes the superconductor of layers 143 and 144 under coil 150 to temporarily lose the superconductive state.

With current removed from coil 150, superconductivity returns and layers 143 and 144 confine magnetic flux detected at the thin magnetic film 142.. As a result, data is extracted by sensing magnetic cell transitions from media 151 by a suitably placed transducer (not shown) in the magnetic circuit which includes thin film 142. Thin film sandwich arrays like 142–144 assure minimum leakage of flux from the magnetic path thereby optimizing readback efficiency while requiring less magnetic circuit saturation for writing.

Figure 9:
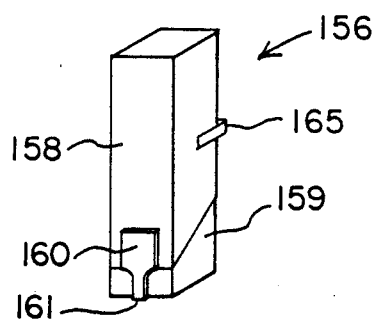
FIG. 9 is an isometric view of a contemporary hybrid single-pole thin film NSP read/write head using a composite ferrite/superconductor substrate and modified in accordance with this invention.

The head shown in FIG. 9 is a version of a contemporary hybrid thin film single-pole head 56. It is constructed with a ferrite block 158 and a wedge shaped superconductor substrate 159 which backs the lower portion of a thin film magnetic element 160 Thin film element 160 is formed with a reduced geometry to face 161 which is the width of one magnetic data track.

Figure 10:
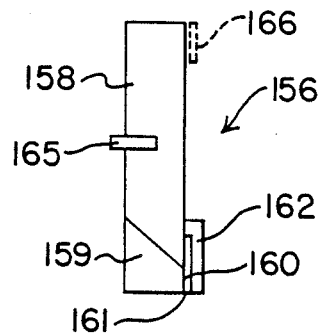
FIG. 10 is a side view of a FIG. 9 head with the magnetic circuit further improved in accordance with this invention.

FIG. 10 illustrates the same components as FIG. 9 except thin film 160 is encased in a superconductor layer 162. Thus magnetic flux present in ferrite member 158 is shunted into thin film 160 by superconductor block 159 and confined by superconductor layer 162 at face 161. The magnetic flux can result from sensing of data at the medium or by inducement from a coil or other suitable element not shown in FIGS. 9 and 10.

Data detection for a FIG. 9 and 10 head is obtained as shown via SQUID 165 which is located in a slot into the magnetic circuit element 158. Placement of the SQUID 165 and its slot into the head concurrent with manufacture of head 156 is an available option to the head fabricator. An alternate (or supplemental) position for a SQUID is shown in dotted outline at 166 in FIG. 10. In manufacture, placement of a magnetic material layer at the top of head 156 around SQUID 166 so that a thickness equivalent to the thickness of main pole 160 and its superconductor overcoat 162 results in an I-bar that is attachable to an auxiliary flux path completing member (not shown) if desired.

Various manufacturing techniques are available for constructing heads using thin film elements With respect to FIGS. 9 and 10 for instance, sputtering and photolithography processes can deposit main pole thin film 160 onto a substrate formed by bonding superconducting ceramic 159 and a polished ferrite 158. Manufacture of multiplicities of such heads is possible by forming a bar of the substrate with spaced main poles 160 interspersed along the length of the substrate. Fabrication of this substrate is then followed by the steps of slicing and dicing of individual heads as is known in the art. If desired, it is possible further to overcoat elements such as pole 160 with superconducting thin films when forming the bars and prior to slicing and dicing.

Figure 11:
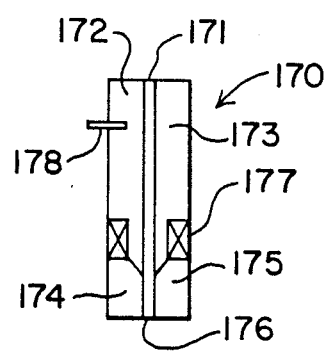
FIG. 11 is a nearly symmetrical version of a single pole, MSP type of thin film head.

FIG. 11 is a generally symmetrical version of a single pole type of thin film head 170. Here a thin film main pole 171 forms a core between the upper ferrite blocks 172 and 173 and the lower superconductor blocks 174 and 175. Preferably pole 171 is configured similar to element 160 in FIG. 9 ending at a face 176 which has a width of about one track. Coil 177 for writing is recessed in a groove into the bodies of blocks 172 and 173 as shown but could as well surround the exterior of those blocks if desired.

In addition, an encasing superconductor coating for the exterior of head 170 can further improve efficiency. This coat could overly coil 177 in its recessed slot or could underlie a similar coil on the exterior with the writing operation to shift the superconductive state of the underlying coating following that described above. Additionally, suitable placement of a transducer such as SQUID 178 can detect the relatively low level of magnetic flux sensed during a read operation. Presence of a superconductive overcoat will enhance the efficiency of detection during reading of data from a medium.

Figure 12:
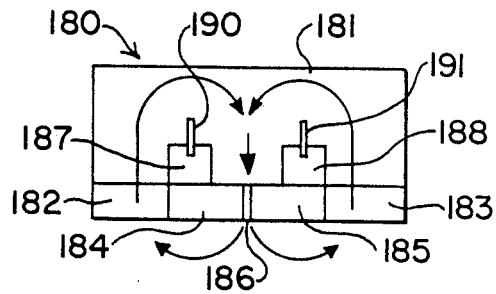
FIG. 12 is an embodiment of an ESP or E-block type, single pole, composite probe thin film head suitable for perpendicular recording and reading.

Yet another embodiment of a composite probe thin film head suitable for perpendicular recording and reading is shown in FIG. 12 as E-block type, single pole head 180. As indicated by the arrows representing a potential magnetic flux pattern, head 180 is formed symmetrically with ferrite block 181 bonded to a composite of ordinary ceramic 182 and 183 along with superconductor blocks 184 and 185. Superconductors 184 and 185 surround thin film main pole 186.

Internal voids 187 and 188 can accommodate a writing coil possibly made from a superconductor material. FIG. 12 shows two detectors in the form of SQUIDS 187 and 188 which, since they are symmetrically located in the magnetic circuit, can reject random noise by having their outputs connected to a differentiating circuit so that an output is produced only when both detectors are sensing a common read signal. In manufacture, the top and bottom of the interface between ferrite flux closure block 181 and elements 182, 183, 184 and 185 are polished.

Figure 13:
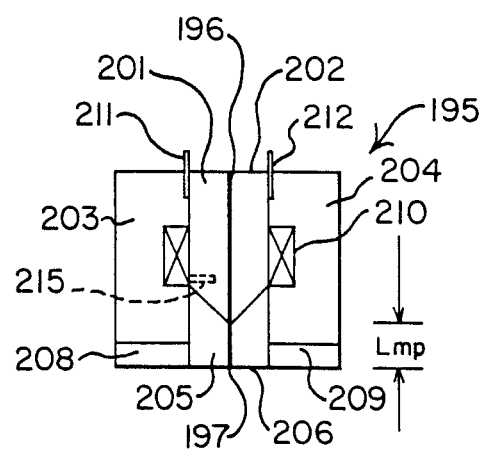
FIG. 13 is a configuration of an MSP head with a thin film main pole on a composite ferrite/superconductor substrate.

The FIG. 12 head is especially well suited for so-called floppy disk applications as is the head 195 of FIG. 13. Head 195 is another configuration of a superconductor substrate, MSP head with a thin film main pole 196 extending through its length ending in main pole face 197. Ferrite blocks 201–204 establish the bulk of the magnetic circuit which is concentrated into face 197 by superconductor elements 205 and 206. Ceramic blocks 208 and 209 complete the composite auxiliary pole pieces which provides the flux return path. These composites are contoured as part of the whole head to provide the mechanical media interface.

Coil 210 in the internal recess and SQUID detectors 211 and 212 (positioned to produce noise rejecting, balanced outputs) round out the head structure 195. Various other detector positions are available such as SQUID 215 shown dotted in FIG. 13. By the use of superconductors for the ceramic components of the composite substrates 201/205 and 202/206, the distance Lmp from the face 197 to the tips of ferrite elements 201 and 202 becomes less critical like the throat height in ring heads.

Figure 14:
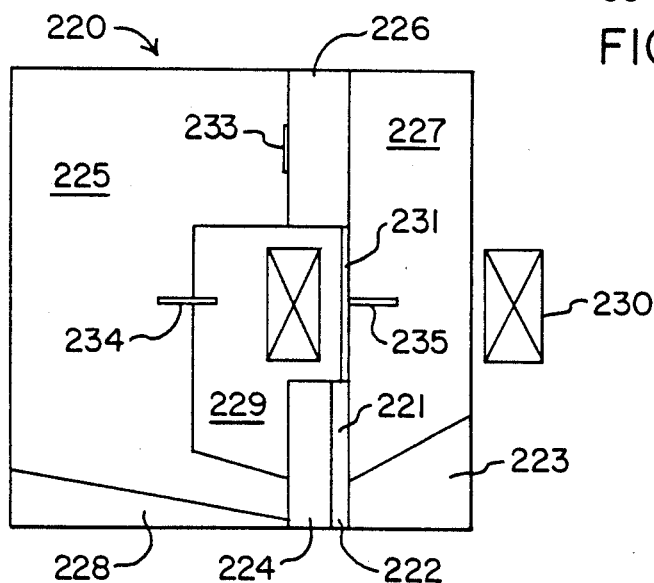
FIG. 14 is another NSP head useful for perpendicular magnetic data exchanges with a medium and constructed with a two piece core design including a thin film main pole sandwiched with superconductor members in proximity to the media interface.

FIG. 14 is a head 220 likewise well suited for perpendicular magnetic data exchanges with a medium and is constructed with a two piece core design. It includes a thin film main pole 221 which has a pole face 222 interfacing with the media (not shown). It is sandwiched at that interface with superconductor members 223 and 224. Ferrite members 225 and 227 are joined by a soft magnetic alloy 226 sputtered in place, for example, to a width equal to the combined widths of pole 221 and superconductor 224. A wedge shaped ceramic element 228 intercedes between the lower face of ferrite member 225 and the media so that any ferrite edge of the auxiliary pole is displaced so as to reduce the potential for generating a false data signal. Note that the assembly including elements 221, 223 and 227 in FIG. 14 is substantially the same as FIG. 9.

Coil 230 is positioned as shown into internal recess 229 and in overlying relation to superconductor layer 231. Any, some or all of SQUIDS 233, 234 and 235 are placed in the magnetic circuit to detect the presence of magnetic flux and its data reflecting changes. The superconductive state of undercoat 231 is switched by introducing an appropriate current to coil 230. By including layer 231 as well as a superconductor layer encasing the entire external surface of head 220 except at the media interface, the efficiency of both data reading and writing is improved. The superconductor coat portion at any point under coil 230 will switch in response to the presence or absence of current in coil 230.

The minimum offset spacing of the lower face of auxiliary pole 225 from the media by intervening wedge member 228 is preferably one half the shortest distance from the medium recording surface to the face of main pole 222. The FIG. 14 core is mounted into the slider body as in the minicomposite format referred to in the ferrite ring head for flying head applications. It may also be mounted in other assemblies for contact recording applications.

Figure 15:
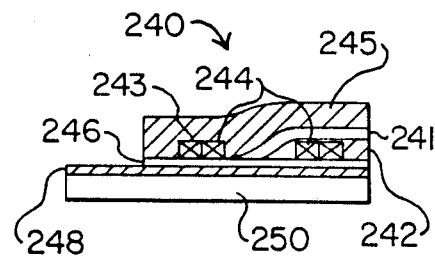
FIG. 15 is an embodiment of an integrated thin film probe head in accordance with this invention.
Figure 16:
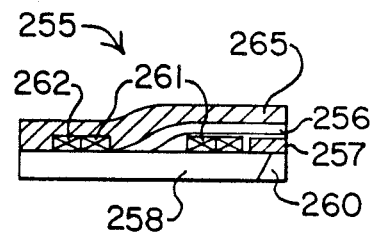
FIG. 16 is another embodiment of an integrated thin film probe head.

An integrated thin film probe head 240 is shown in section view in FIG. 15. It includes a thin film main pole 241 and an auxiliary pole 246 which are separated at the media interface by a superconductor block 242. Coils 243 and 244 are positioned so as to magnetically communicate with main pole 241 while superconductor layers 245 and 248 effectively encase head 240 except at the media pole faces for poles 241 and 246. The head 240 is fabricated on substrate 250 which can also be of superconductor material A somewhat similar integrated thin film probe head 255 is shown in FIG. 16. The thin film main pole 256 forms a magnet circuit with auxiliary pole 258 which is a ferrite or another thin magnetic film. A superconductor plug 257 fills the space between poles 256 and 257 at the media interface while coils 261 and 262 are in magnetic communication with main pole 256. A ceramic or non-magnetic wedge shaped block 260 completes the media interface for auxiliary pole 258 so that any ferrite edge associated with pole 258 is displaced enough to avoid erroneous apparent signals. Pole 258 is preferably formed by thin film deposition of a relatively thick layer as compared to the layer for main pole thin film 256. The embodiments of FIGS. 15 and 16 are particularly well suited for automated thin film manufacture. Further, the existence of a superconductor environment makes it attractive to construct the coils of heads 240 and 255 from superconductive material thereby enhancing thin film manufacture of these heads.

While not specifically shown herein, the thin film main poles are typically configured with a reduced cross-section generally along the lines of main pole 160 in FIGS. 9 and 10. This applies to pole 142 in FIG. 8, pole 171 in FIG. 11, pole 186 in FIG. 12, pole 196 in FIG. 13, pole 222 in FIG. 14, pole 241 in FIG. 15, and pole 256 in FIG. 16.

Typical materials for either the thin film pole pieces, the auxiliary pole pieces, or both, include NiFe, CoZrNb, FeSiAl, etc.

It is possible to construct a single or multi-turn coil of superconductive material. Writing of magnetic data is a function of the coil ampere-turns and the typical magnetic write head has a resistance of 3 to 5 ohms. With a superconductor coil, writing is accomplished at essentially zero resistance. Such a coil is particularly advantageous since the zero resistance means zero thermal noise.

Manufacturing cost of the heads configured in accordance with this invention are significantly reduced because one of the more difficult lapping processes is substantially minimized, and the precise control of throat height is not as significant an issue.

Read pick-up flux is no longer lost across the gap but will link the coils and therefore the detectors. This is the significant impact on the magnetic circuit by the Meissner Effect. The readback circuit efficiency is proportional to the number of flux lines linking the readback transducer (coil or SQUID).

As mentioned above, thermal noise is proportional to the square root of the product of 4kTBR. Making the coils as loops of superconductive material so that R in this product approaches zero eliminates that source of resistive noise. If the system including the elements such as the preamplifier are immersed in liquid nitrogen fumes, both the magnetic and amplifier noise is reduced to about ½ that at room temperature.

Utilization of read/write heads pursuant to this invention permits a significant increase in practical areal density by virtue of the increased signal to noise ratio (SNR). The signal at the read head is proportional to the linear track width whereas the SNR is proportional to the square root of the track width. Thus reduction of the head signal by ¼th reduces the SNR by ½. Side or off-track field fringing is minimized while read/write efficiency is maximized due to the Meissner Effect. Furthermore, amplifier and magnetic noise is reduced because of the cryogenic environment. A 2 uM pitch with a 1 uM track width is believed entirely feasible where uM is a micron. This allows a density of 12,500 tracks per inch which is quite competitive with optical track densities.

The present invention is well suited for markedly improving performance of a magnetic recording system that centers about the present approach to magnetic mechanisms—e.g. conventional disc and tape drives generally using contemporary geometry for vertical and horizontal recording. The main departure is in utilizing the Meissner Effect to focus on reducing both the mechanisms associated with head signal loss and crosstalk from adjacent tracks and the use of a SQUID to detect the recorded magnetic fields. The other considerations associated with lower noise due to a lower ambient temperature do appear useful, however. Contemporary thin film head fabrication techniques are available for constructing heads and various other drive elements in accordance with this invention.

Preferably a stable environment at liquid nitrogen temperature is established for the head and the other superconductor elements of the drive with that environment maintained despite the presence of significant heat sources. For example, heat may well result from gas friction due to rotating platters, from operation of the drivers, and from current heating. Even with conventional windings, heat from these sources is reducible to about 1/50th that of present heads and by virtue of head efficiency.

Preferably the heads thus described are packaged in an atmosphere suitable for the superconductors such as by cooling to about 7720 Kelvin through liquid nitrogen vapor. Liquid nitrogen is relatively inexpensive and storable in insulators as ordinary as a conventional thermos bottle with only moderate evaporation rates. As further enhancements to superconductor materials at higher temperatures are developed, the system cost will improve even further. For large systems with large amounts of data with medium access times for the magnetic disk are involved, closed cycle refrigeration systems are also practical.

Selection between the various Type I and Type II superconductor materials in designing systems in accordance with this invention is a function of the anticipated current and magnetic flux levels. Type I superconductors exhibit more complete ability to divert or direct magnetic flux but may change state at lower current carrying levels as compared to Type II. Type II superconductors are less susceptible to abrupt state transitions and can handle the higher current and magnetic field levels. Note that heads in accordance with this invention are well suited for high efficient usage in a vacuum environment as well as for mounting on superconductor bearings rather than conventional bearings or air bearings especially since a superconductor environment is already present.

With respect to a given superconductor material, the critical field Hc1 is at the temperature above which magnetic fields are no longer completely excluded, whereas Hc2 is at the temperature where the material exhibits its complete transition between superconducting and normal states. For complete magnetic shielding, it is generally preferable to operate type two material below Hc1 although drive coils may operate at high current density or fields up to Hc2.

Note that heads in accordance with this invention are particularly useful in conjunction with superconductor recording media especially since the necessary cryogenic source is available. Such media might typically comprise a magnetic recording layer over a superconductor substrate. This confines the magnetic flux in the recording layer thus providing reduction of losses from stray flux and isolation of the upper recording layer from a lower recording layer, if any.

FIG. 17 is an isometric view of a minicomposite slider assembly 270 including a read/write head. It is formed from a block 271 with a central channel 272 cut into its length so as to form bearing ridges 273 and 274. As is conventional, the leading and trailing edges of 273 and 274 are angled for air bearing purposes although only shown in FIG. 17 at leading edge faces 275 and 276. Slots 278 and 279 are cut into one end face of body 271. Transverse slot 279 is configured to accept magnetic read/write head core 280 as shown to interface with the magnetic disk which travels over the bearing surfaces 273 and 274 in the direction of arrow 281. Slot 278 can accommodate coil windings as appropriate.

For thin film heads along the lines of those described for FIGS. 15 and 16, slot 279 is not needed as it is possible to deposit such heads directly on the face of body 271. Body 271 can form the substrate mentioned as an element in one or more previously discussed head embodiments. By making it of high Tc superconductor material, slider 270 can establish a magnetic bearing. In an evacuated or near vacuum environment, the magnetic bearing alone can allow the disk media and slider to float relative to one another, but it can function in cooperation with an air bearing. Use of superconductor material for body 271 can also provide environmental shielding in addition to the substrate function.

Although the present invention is described herein with particularity relative to the foregoing detailed description of the exemplary embodiments, those having normal skill in the art will recognize various modifications, changes, additions and applications of the present invention in addition to those mentioned herein without departing from the spirit of this invention.

What is claimed is:

1. A head for interfacing with a magnetic recording media comprising:
    a member of magnetic material forming at least a portion of a magnetic flux circuit ending with a pole face surface in interfacing relation to the media for establishing a main pole in proximity to the media in said magnetic flux circuit,
    magnetically responsive means in magnetically coupled relation to said magnetic flux circuit,
    means encasing at least a portion of the external surfaces of said member with superconductive material except for the media interfacing portion of said pole face surface, said encasing means including superconducting material substantially surrounding said magnetic flux circuit in proximity to said pole face surface, and
    means establishing an environment for said superconductive material at a temperature for maintaining said superconductive material in its superconductive state,
    whereby magnetic flux in said magnetic flux circuit associated with said encasing means is concentrated within said magnetic flux circuit while placement of said pole face surface in proximity to the recording media permits sensitive magnetic flux controlled information exchanges between the media and said head.

2. A head in accordance with claim 1 wherein said terminal portion of said magnetic flux circuit forming member concludes with a smaller cross-sectional area at said pole face surface relative to the cross-sectional area of said magnetic circuit at the end of said terminal portion opposite said pole face surface, an said encasing means includes means constructed of superconductive material and arranged to encase said magnetic circuit throughout the length of said magnetic flux circuit terminal portion and ending in proximity to said main pole for concentrating magnetic flux therefrom into intercepting relation with a magnetic storage layer of the media, whereby introduction of magnetic flux to said magnetic flux circuit produces perpendicular data recording in the media.

3. A head in accordance with claim 2 which includes auxiliary flux returning means magnetically communicating with said member for substantially completing said magnetic flux circuit and ending with a pole face surface in interfacing relation to the media for completing said magnetic circuit as an auxiliary pole.

4. A head in accordance with claim 3 wherein said member pole face surface is of a relatively small area as compared to said flux returning means auxiliary pole face surface area for establishing perpendicular data recording in the media under said member surface while not magnetizing the media under said auxiliary flux returning surface.

5. A head in accordance with claim 1 in which said magnetically responsive means further includes SQUID means coupled to said magnetic flux circuit for detecting magnetic flux therein.

6. A head in accordance with claim 5 in which said magnetically responsive means further includes a coil magnetically coupled to said magnetic flux circuit, and
means selectively energizing said coil for introducing magnetic flux changes to said magnetic flux circuit.

7. A head in accordance with claim 1 in which said magnetically responsive means includes a coil magnetically coupled to said magnetic flux circuit, and
means selectively energizing said coil for introducing magnetic flux changes to said magnetic flux circuit.

8. A head in accordance with claim 7 wherein a layer of said superconducting encasing means forms a barrier between said coil and said magnetic circuit, said layer being constructed and arranged for shifting from a superconductor state to a normal magnetic flux transmitting state in response to operation of said selectively energizing means and for remaining in said superconductor sate whenever said coil is not energized.

9. A head in accordance with claim 7 wherein said coil is composed of at least one loop of superconductive material.

10. A head in accordance with claim 9 wherein said magnetically responsive means further includes a magnetic transducer coupled to said magnetic circuit for producing an output correlated to data contained on the media.

11. A head in accordance with claim 10 wherein said transducer is a SQUID coupled to intercept magnetic flux present in said magnetic circuit.

12. A probe type head for interfacing with at least one data track on a magnetic media comprising:
an elongated, thin film of magnetic material having one end face with a width corresponding to the track width on the magnetic media and forming the main pole of the head,
a coating of superconductor material encasing at least a portion of the length of said thin film except said one end face,
means establishing an environment for said superconductor material at a temperature for maintaining said material in a superconductive status,
magnetically responsive means in magnetically coupled relation to said thin film, and
means assembling said thin film, said coating and said magnetically responsive means for cooperating with structure associated with the media so as to position said thin film in generally perpendicular relation tot he magnetic media with said main pole end face in proximity to the data containing tracks on the media for magnetic communication between said magnetically responsive means and the media.

13. A head in accordance with claim 12 which includes magnetic material in overlying relation to said thin film from the end opposite said track width end to a point in spaced relation from said track width end.

14. A head in accordance with claim 13 wherein said superconductor material coating encases said thin film from said track width end face to said spaced relation point along the length of said thin film.

15. A head in accordance with claim 14 wherein said magnetically responsive means includes a coil magnetically coupled to said overlying magnetic material, and means for selectively energizing said coil for introducing a magnetic flux pattern into said thin film corresponding to data for recording on the media.

16. A head in accordance with claim 14 wherein said magnetically responsive means includes a transducer connected in the magnetic circuit of said thin film and said overlying magnetic material for detecting magnetic flux corresponding to data contained magnetically on the media.

17. A head in accordance with claim 16 wherein said transducer includes a SQUID for sensing magnetic flux present in said thin film, and
said coil is composed of at least one loop of superconductive material.

18. A head in accordance with claim 14 which further includes an auxiliary pole means of magnetic flux conducting means connected for completing a magnetic circuit into an interface in proximity to the media in spaced relation to said main pole face with said magnetic circuit including said thin film, said overlying magnetic material and said auxiliary pole means.

19. A head in accordance with claim 18 wherein said main pole track width end is of an area for causing magnetization of the media when flux of a preselected density is introduced to said magnetic circuit while magnetic flux of said predetermined density passing through the area of said auxiliary pole means interface does not change the magnetic state of the media.

20. A head in accordance with claim 19 wherein said coating substantially encases the external surfaces of said head with superconductor material except for the media interface of said main pole face and the media interface of said auxiliary magnetic flux conducting means.

21. A head in accordance with claim 20 wherein said magnetically responsive means includes a SQUID in said magnetic flux circuit.

* * * * *